United States Patent
Kadowaki

(10) Patent No.: US 9,537,066 B2
(45) Date of Patent: Jan. 3, 2017

(54) METHOD OF MANUFACTURING SEMICONDUCTOR LIGHT EMITTING DEVICE, AND SEMICONDUCTOR LIGHT EMITTING DEVICE

(71) Applicant: DOWA ELECTRONICS MATERIALS CO., LTD., Tokyo (JP)

(72) Inventor: Yoshitaka Kadowaki, Tokyo (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

(21) Appl. No.: 14/909,359

(22) PCT Filed: Jul. 30, 2014

(86) PCT No.: PCT/JP2014/070026
§ 371 (c)(1),
(2) Date: Feb. 1, 2016

(87) PCT Pub. No.: WO2015/016246
PCT Pub. Date: Feb. 5, 2015

(65) Prior Publication Data
US 2016/0197251 A1    Jul. 7, 2016

(30) Foreign Application Priority Data
Jul. 30, 2013   (JP) ................................ 2013-158167

(51) Int. Cl.
*H01L 33/00* (2010.01)
*H01L 33/58* (2010.01)
(Continued)

(52) U.S. Cl.
CPC ............... *H01L 33/58* (2013.01); *H01L 33/20* (2013.01); *H01L 33/22* (2013.01); *H01L 2933/0058* (2013.01); *H01L 2933/0091* (2013.01)

(58) Field of Classification Search
CPC ........... H01L 33/20; H01L 33/22; H01L 33/58
(Continued)

(56) References Cited

U.S. PATENT DOCUMENTS

| 2005/0285132 A1 | 12/2005 | Orita |
| 2007/0059852 A1 | 3/2007 | Miyachi et al. |

(Continued)

FOREIGN PATENT DOCUMENTS

| JP | 2006-049855 A | 2/2006 |
| JP | 2011-181834 A | 9/2011 |

(Continued)

OTHER PUBLICATIONS

Sep. 2, 2014 Search Report issued in International Patent Application No. PCT/JP2014/070026.

*Primary Examiner* — David Vu
*Assistant Examiner* — Brandon Fox
(74) *Attorney, Agent, or Firm* — Oliff PLC

(57) ABSTRACT

When an uneven pattern is formed on a light extraction surface composed of a semiconductor crystal by wet-etching using an alkaline solution, a plurality of convex portions cannot be formed in a desired arrangement. A method of manufacturing a semiconductor light emitting device includes a light extraction surface composed of a semiconductor crystal, wherein when the uneven pattern is formed by a plurality of convex portions on the light extraction surface, first, a plurality of impressions are formed on the light extraction surface of a semiconductor layer composed of a semiconductor crystal using a processing substrate, and next, by applying wet-etching to the light extraction surface using an alkaline solution, to thereby form convex portions with a portion where each impression is formed as a top portion, and a plurality of facets of the semiconductor crystal as a side face thereof.

13 Claims, 9 Drawing Sheets

(51) Int. Cl.
*H01L 33/22* (2010.01)
*H01L 33/20* (2010.01)

(58) Field of Classification Search
USPC .......................................................... 257/95
See application file for complete search history.

(56) References Cited

U.S. PATENT DOCUMENTS

| | | | |
|---|---|---|---|
| 2010/0072501 A1* | 3/2010 | Wakai | H01L 33/20 257/98 |
| 2010/0120237 A1* | 5/2010 | Tanaka | H01L 33/0095 438/507 |
| 2012/0228670 A1 | 9/2012 | Saito | |

FOREIGN PATENT DOCUMENTS

| | | |
|---|---|---|
| JP | 2012-186335 A | 9/2012 |
| JP | 2013-138139 A | 7/2013 |
| WO | 2005/043633 A1 | 5/2005 |

\* cited by examiner (A)           (B)

(C)           (D)

(A)

(B)

(A)

(B)

METHOD OF MANUFACTURING SEMICONDUCTOR LIGHT EMITTING DEVICE, AND SEMICONDUCTOR LIGHT EMITTING DEVICE

TECHNICAL FIELD

The present invention relates to a method of manufacturing a semiconductor light emitting device having a light extraction surface and composed of a semiconductor crystal, and the semiconductor light emitting device.

DESCRIPTION OF RELATED ART

Improvement of a light emitting efficiency and improvement of a light extraction efficiency are requested for a semiconductor light emitting device. Particularly, as a technique of improving the light extraction efficiency, a technique of forming an uneven pattern on the light extraction surface of the semiconductor light emitting device, is known. As an example, patent document 1 teaches a technique of forming the uneven pattern having a plurality of convex portions on a surface of a nitride semiconductor layer, by applying wet-etching using an alkaline solution, to the surface of the nitride semiconductor layer which forms the light extraction surface.

PRIOR ART DOCUMENT

Patent Document

Patent document 1: Japanese Patent Laid Open Publication No. 2011-181834

SUMMARY OF THE INVENTION

Problem to be Solved by the Invention

However, in the abovementioned conventional technique, the following inconvenience is generated.

That is, if the wet-etching is applied to the surface of the nitride semiconductor layer using the alkaline solution, dissolving erosion is separately advanced due to in-plane etching applied to the nitride semiconductor layer. Therefore, arrangement of the convex portions formed by etching becomes irregular. In order to form the uneven pattern of several micrometers or less in a regular arrangement, generally photolithography or nanoimprint method is used. However, these methods require an expensive apparatus or material. Also, there is a problem that much time is required for forming the uneven pattern through a plurality of processes from forming a mask to an etching treatment as a process. Accordingly, even if there is the arrangement of the convex portions preferable for improving the light extraction efficiency, a technique of facilitating this uneven pattern is required.

A main object of the present invention is to provide a method of manufacturing a semiconductor light emitting device capable of forming a plurality of convex portions in a desired arrangement when an uneven pattern is formed by applying etching to a light extraction surface composed of a semiconductor crystal, and the semiconductor light emitting device realized by this method.

Means for Solving the Problem

A process until inventors of the present invention achieves the present invention, will be described first.

In order to confirm a change of a light extraction surface state, when an uneven pattern is formed by applying etching to the light extraction surface of a nitride semiconductor layer, the inventors of the present invention measures a surface shape of the light extraction surface using a probe type step profiler. At this time, the inventors of the present invention apply wet-etching to the light extraction surface by an alkaline solution, and measure the surface shape of the light extraction surface using the probe type step profiler. Further, the inventors of the present invention perform magnifying observation to the surface shape of the light extraction surface after etching using an electron microscopy. Then, it is found that there is a significantly interesting part on the surface of the light extraction surface after etching. Specifically, it is found that a continuous shape like a ridge of mountain is present on the surface of the light extraction surface after etching.

Therefore, after various efforts by the inventors of the present invention regarding why such a specific shape appears by etching, consequently it is found that the specific shape appears at a part tracing the light extraction surface by the probe type profiler, in the shape measurement before etching. However, if the light extraction surface is traced by the probe of the profiler, the traced part becomes in a scratched state. Therefore, from a viewpoint of a general technical knowledge that "a scratched part is easily etched" during etching, a phenomenon in which the part traced by the probe remains as the abovementioned specific shape, is unexpected for the inventors of the present invention. When simply considering, remaining of such a specific part at a part of the light extraction surface, is regarded as not contributing to the improvement of the light extraction efficiency.

However, after efforts by the inventors of the present invention even after the abovementioned knowledge is obtained, and as a result of a deep consideration regarding the "phenomenon in which the place traced by the probe remains as the specific shape", a useful concept leading to the improvement of the light extraction efficiency can be obtained. Specifically, it is conceivable that the scratched part by the probe is more hardly etched than the other part, and in this case, when the scratched part is intentionally made at a part where the convex portion is desired to be formed and thereafter etching is applied thereto, the convex portion can be formed in a desired arrangement. Then, based on this concept, the following invention is provided.

According to a first aspect of the present invention, there is provided a method of manufacturing a semiconductor light emitting device having a light extraction surface and composed of a semiconductor crystal, including:

forming an uneven pattern on the light extraction surface, the formation of the uneven pattern further comprising:

a first step of forming a plurality of pressed marks on the light extraction surface; and a second step of forming a plurality of convex portions with portions where the pressed marks are formed as top portions and a plurality of facets of the semiconductor crystal as a side face thereof, by applying etching to the light extraction surface on which the plurality of pressed marks are formed.

According to a second aspect of the present invention, there is provided the method of manufacturing a semiconductor light emitting device of the first aspect, wherein in the first step, the plurality of pressed marks on the light extraction surface are formed by pressing a plurality of protrusions against the light extraction surface using a processed substrate having the plurality of protrusions.

According to a third aspect of the present invention, there is provided the method of manufacturing a semiconductor light emitting device of the first aspect 1 or 2, wherein in the second step, the light extraction surface is wet-etched using an alkaline solution.

According to a fourth aspect of the present invention, there is provided the method of manufacturing a semiconductor light emitting device of any one of the first to third aspects, wherein in the second step, etching is applied to the light extraction surface, so that at least the impression is remained on the top of the convex portion, or at least one ridge line of the ridge lines where the plurality of facets are adjacent to each other, is formed as multi-lines.

According to a fifth aspect of the present invention, there is provided the method of manufacturing a semiconductor light emitting device of any one of the first to fourth aspects, wherein in the second step, the convex portion is formed into a hexagonal pyramid, with a portion where the impression is formed as a top portion.

According to a sixth aspect of the present invention, there is provided the method of manufacturing a semiconductor light emitting device of the second aspect, wherein in the first step, a substrate made of a material having a higher hardness than the semiconductor crystal and on which the plurality of protrusions are geometrically arranged, is used as the processing substrate.

According to a seventh aspect of the present invention, there is provided the method of manufacturing a semiconductor light emitting device of the sixth aspect, wherein in the first step, the plurality of protrusions are geometrically arranged at constant intervals.

According to an eighth aspect of the present invention, there is provided the method of manufacturing a semiconductor light emitting device of the second, sixth, or seventh aspect, wherein in the first step, a load added on the light extraction surface is set to 1 mgf or more and 400 mgf or less per one protrusion of the processing substrate.

According to a ninth aspect of the present invention, there is provided the method of manufacturing a semiconductor light emitting device of any one of the first to eighth aspects, wherein the semiconductor crystal is a group III nitride semiconductor crystal.

According to a tenth aspect of the present invention, there is provided the method of manufacturing a semiconductor light emitting device of the ninth aspect, wherein the group III nitride semiconductor is AlN.

According to an eleventh aspect of the present invention, there is provided a semiconductor light emitting device, including:
a light extraction surface composed of a semiconductor crystal;
wherein the light extraction surface comprises an uneven pattern in which a plurality of convex portions are lined up,
each of the convex portions has a side face composed of a plurality of facets of the semiconductor crystal,
and each convex portion has a pressed mark on the top of the convex portion thereof, or at least one ridge line arranged as multi-line of the ridge lines where the plurality of facets are adjacent to each other.

According to a twelfth aspect of the present invention, there is provided the semiconductor light emitting device of the eleventh aspect, wherein the semiconductor crystal is a crystal of group III nitride semiconductor.

According to a thirteenth aspect of the present invention, there is provided the semiconductor light emitting device of the eleventh or twelfth aspect, wherein the convex portion is made of AlN.

Advantage of the Invention

According to the present invention, when an uneven pattern is formed by applying etching to a light extraction surface composed of a semiconductor crystal, a plurality of convex portions can be formed in a desired arrangement.

DETAILED DESCRIPTION OF THE INVENTION

Embodiments of the present invention will be described hereafter, with reference to the drawings.

In the embodiments of the present invention, explanation is given in the following order.
1. Method of manufacturing a semiconductor light emitting device
 1-1. First step
 1-2. Second step
2. Structure of a semiconductor light emitting device
3. Effect of embodiments
4. Modified example, etc.

<1. Method of Manufacturing a Semiconductor Light Emitting Device>

A method of manufacturing a semiconductor light emitting device according to an embodiment of the present invention will be described first.

The method of manufacturing a semiconductor light emitting device according to an embodiment present invention has an uneven pattern formation step in a series of a manufacturing step. The uneven pattern formation step is the step of forming an uneven pattern on a light extraction surface of the semiconductor light emitting device, using an exposed surface composed of a semiconductor crystal as the light extraction surface.

Figure 1:
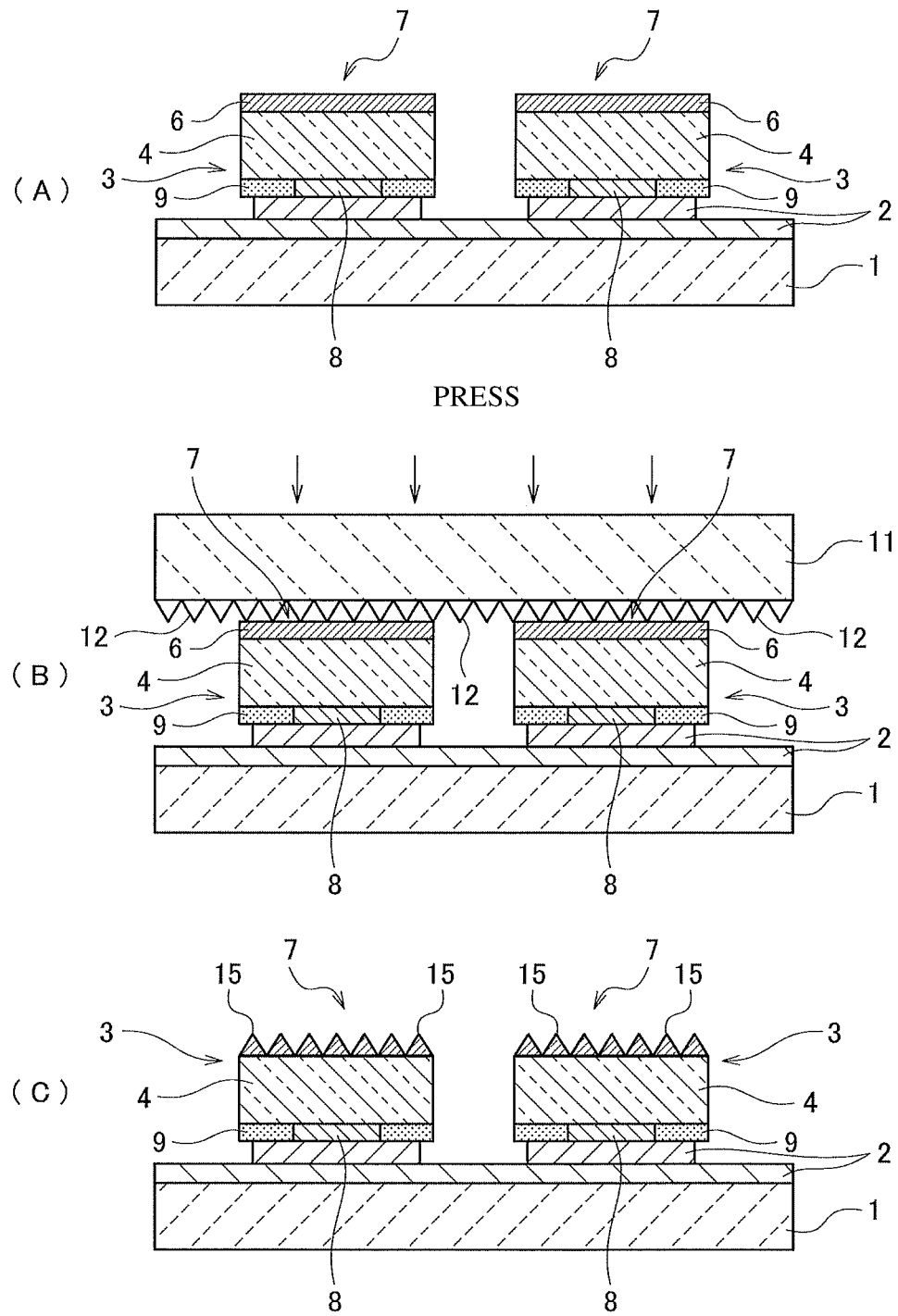
FIGS. 1(A) to (C) are views showing a method of manufacturing a semiconductor light emitting device according to an embodiment of the present invention.

FIGS. 1(A) to (C) show the method of manufacturing a semiconductor light emitting device according to an embodiment of the present invention, and particularly show a procedure of the uneven pattern formation step.

First, explanation is given for a structure example of the semiconductor light emitting device before being processed in the uneven pattern formation step, using FIG. 1(A). In this FIG. 1(A), two light emitting devices 3 are mounted on a supporting substrate 1 via an adhesive layer 2. Each light emitting device 3 has at least a light emitting layer as an active layer, and a laminated semiconductor 4 including a first conductive layer and a second conductive layer with this light emitting layer sandwiched between them. The laminated semiconductor 4 is obtained by sequentially forming a plurality of semiconductor layers by epitaxial growth on a substrate (for example, a sapphire substrate, etc.) for crystal growth not shown. The substrate for crystal growth is removed (peeled) by chemical liftoff, after being mounted on the supporting substrate 1 by inverting a semiconductor light emitting device 3 upside down, which is formed using this substrate.

The light emitting layer is composed of a nitride semiconductor layer. Further, for example the first conductive layer out of the first conductive layer and the second conductive layer, is composed of a n-type nitride semiconductor layer, and the second conductive layer is composed of a p-type nitride semiconductor layer. The first conductive layer and the second conductive layer are composed of a group III nitride semiconductor respectively. As an example, the light emitting layer is composed of AlInGaN, and the first conductive layer and the second conductive layer are composed of AlGaN. Thus, the light emitting device 3 functions as an ultraviolet light emitting device. A material composition, etc., is suitably selected by a light emission wavelength of the light emitting device.

A semiconductor layer 6 is formed on the first conductive layer side (upper side in the figure). A conductive type of the semiconductor layer 6 is the same n-type as the abovementioned first conductive layer. The semiconductor layer 6 has a light extraction surface 7 on the n-type semiconductor layer side. The semiconductor layer 6 is composed of the group III nitride semiconductor of a semiconductor crystal. Here, as an example, the semiconductor layer 6 is composed of an AlN (aluminum nitride) layer, and an AlGaN (gallium aluminum nitride) layer is formed on its underlayer. In this case, the semiconductor layer 6 is a hexagonal semiconductor crystal. The surface of the semiconductor layer 6 is exposed to outside, and this exposed surface is used as the light extraction surface 7. The light extraction surface 7 is a surface for extracting a light to outside, the light being emitted from the light emitting layer. The light extraction surface 7 is preferably a nitrogen polar surface side of the group III nitride semiconductor. By disposing the light extraction surface 7 on the nitrogen polar surface side, formation of the convex portions described later becomes easy.

p-side electrode 8 is formed at the second conductive layer side (lower side in the figure). The electrode 8 is electrically and mechanically connected to the adhesive layer 2. A protective layer 9 is formed on an outer peripheral part of the electrode 8. The protective layer 9 is a layer made of $SiO_2$ (silicon oxide) for example.

In the uneven pattern formation step, an uneven pattern is formed for the semiconductor light emitting device having the above structure, on the light extraction surface 7 of the semiconductor layer 6, through at least two steps. Each step will be described hereafter.

(1-1. First Step)

In the first step, a plurality of impressions are formed on the light extraction surface 7 of the semiconductor layer 6. In this step, as shown in FIG. 1(B), a processing substrate 11 is used for forming the impressions. For example, a plurality of protrusions 12 are formed on a main surface of the processing substrate 11 in a geometrical arrangement at constant intervals. Therefore, in the first step, a plurality of impressions are formed on the light extraction surface 7, by pressing the plurality of protrusions 12 of the processing substrate 11 against the light extraction surface 7 of the light emitting device 3.

The "processing substrate" described in this specification, refers to a substrate having a plurality of protrusions formed on at least one main surface, by a physical processing or a chemical processing or both of them. Further, the "impression" described in this specification, refers to a dent remained on a place on which a load is added, when the load is locally added on the light extraction surface. Typically, the "impression" refers to a dent portion under the load. However, the "impression" is not limited thereto, and includes a portion where distortion, etc., is generated in a crystal structure (atomic ordering) of the semiconductor crystal under the load.

The processing substrate 11 used in the first step will be more specifically described. The processing substrate 11 is made of a material having a higher hardness than the semiconductor layer (semiconductor crystal) 6 constituting the light extraction surface 7. Although there are several scales in the hardness, here, as an example, most generally used Vickers hardness (HV) is defined as the "hardness". When the semiconductor layer 6 is composed of the AlN layer, the hardness of AlN is HV=1230, and therefore the material of the processing substrate 11 may be a material having the higher hardness. As a specific name of the material for example, $TiB_2$, TiC, TiN, $ZrB_2$, ZrC, ZrN, $VB_2$, VC, VN, $NbB_2$, NbC, NbN, $TaB_2$, TaC, $CrB_2$, $Cr_3C_2$, $Mo_2B_5$, $Mo_2C$, $W_2B_5$, WC, $LaB_6$, $B_4C$, B, $AlB_{12}$, SiC, $SiB_6$, $Si_3N_4$, $Al_2O_3$, $AlTiO_4$, and BeO, etc., can be used for the material of the processing substrate 11.

However, a plurality of fine protrusions 12 are required to be formed on the surface of the used processing substrate 11 in a geometrical arrangement. In the material of the substrate satisfying the abovementioned hardness condition, a patterned sapphire substrate obtained by applying processing to $Al_2O_3$ (sapphire) substrate, is manufactured as a substrate for growing a nitride semiconductor, and can be easily available. In this embodiment, an interval of the arrangement pattern (called a "pitch" hereafter) can be arbitrarily set in a range that can be available according to the formation of the uneven pattern formed later. For example, a patterned sapphire substrate with a pitch of 1 μm to 3 μm can be used for the processing substrate 11. In this processing substrate 11, each protrusion 12 is formed into a mountain shape or a semi-spherical shape, using a technique such as nano-imprint, etc.

Figure 2:
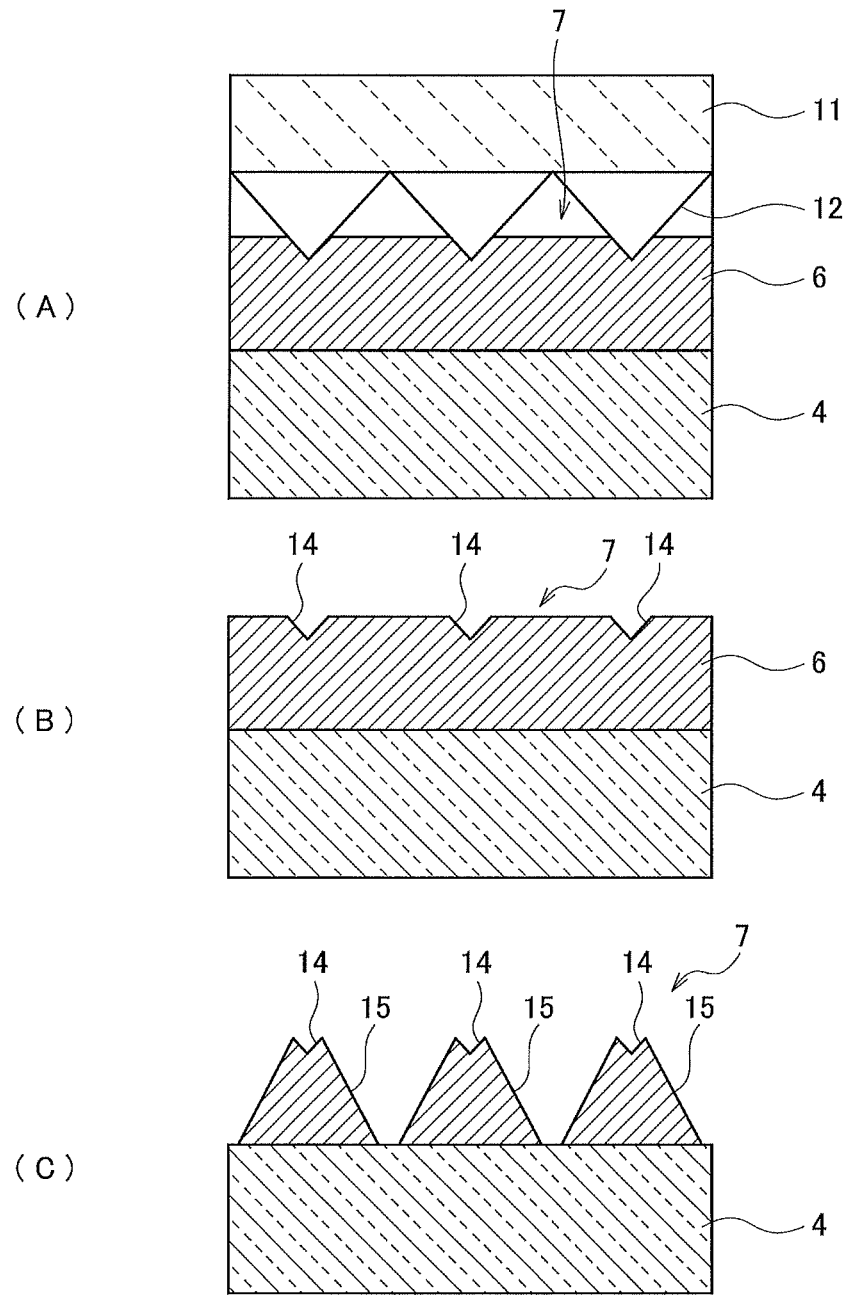
FIGS. 2(A) and (B) are views showing a formation of impressions by the first step, and (C) is a view showing a formation of convex portions by the second step.
Figure 3:
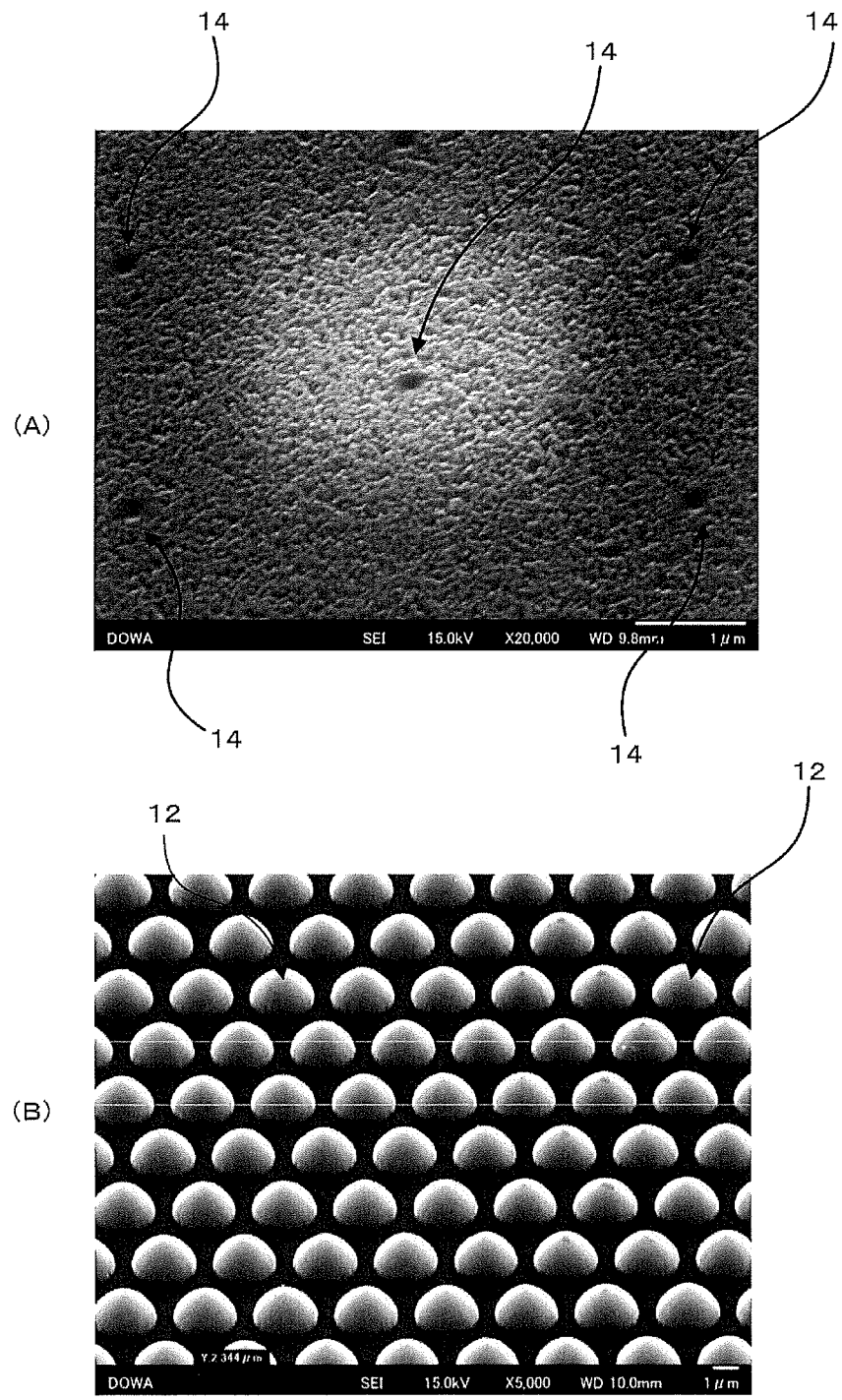
FIG. 3(A) is an electronic microscope photograph obliquely photographing a surface shape after performing formation of impressions, and (B) is an electronic microscope photograph obliquely photographing a surface shape of a processing substrate used for the formation of impressions.

When the abovementioned processing substrate 11 is prepared, as shown in FIG. 1(B), a plurality of protrusions 12 of the processing substrate 11 are pressed against the light extraction surface 7 of each light emitting device 3. At this time, as shown in FIG. 2(A), the protrusions 12 of the processing substrate 11 are pressed against the light extraction surface 7 of the light emitting device 3 by adding a suitable load thereto, and thereafter as shown in FIG. 2(B), if the processing substrate 11 is separated from the light extraction surface 7 of the light emitting device 3, a plurality of impressions 14 are remained on the extraction surface 7. These impressions 14 are formed by a local dent of the light extraction surface 7 at a part in contact with the protrusions 12 of the processing substrate 11. Therefore, a plurality of impressions 14 formed on the light extraction surface 7 of the light emitting device 3 are formed in the same arrangement as the plurality of protrusions 12 of the processing substrate 11. A pressing condition applied in this step may be set as follows: pressure=6 MPa for example, depending on a size of the processing substrate 11 or an area of the light extraction surface 7. Further, the load added on the light extraction surface 7 may be set in a range of 1 mgf or more and 400 mgf or less per one protrusion of the processing substrate 11 (the reason is described later). FIG. 3(A) is an electronic microscope photograph obliquely photographing a surface shape of the processing substrate after forming the impressions, and FIG. 3(B) is an electronic microscope photograph obliquely photographing the surface shape of the processing substrate used for forming the impressions.

In this embodiment, when a plurality of protrusions 12 are pressed against the light extraction surface 7, it is assumed that the supporting substrate 1 is fixed for supporting the light emitting device 3, and the processing substrate 11 is moved in a direction approaching the supporting substrate 1. However, other than this embodiment, for example it is also acceptable that the substrate 1 is moved in a direction approaching the processing substrate 11, with the processing substrate 11 fixed, and both of the supporting substrate 1 and the processing substrate 11 are moved in a direction approaching each other, to thereby press the plurality of protrusions 12 against the light extraction surface 7.

Also, the pressing step may be performed multiple numbers of times. For example, the impressions may be formed on the entire supporting substrate 1 by pressing a small-sized processing substrate 11 against the supporting substrate 1 multiple numbers of times for example.

For example it is also possible to form the impressions at a pitch of 1 μm by pressing the processing substrate 11 multiple numbers of times in a triangular arrangement at a pitch of 2 μm.

An advantage of performing multiple numbers of times of pressing, is that the load added during pressing can be reduced, in the case of the same load per one protrusion.

(1-2. Second Step)

Next, as shown in FIG. 1(C), the uneven pattern by a plurality of convex portions 15 is formed on the light extraction surface 7, by applying etching to the light extraction surface of the semiconductor layer 6 on which a plurality of impressions 14 are formed in the above step. The convex portions 15 are formed so that a part of the semiconductor layer 6 composed of the semiconductor crystal remains in a convex shape. In this step, wet-etching (anisotropic etching) is applied to the light extraction surface 7 of the semiconductor layer 6 using an alkaline solution, without using an etching mask, etc. For example it is preferable that the alkaline solution containing TMAH (tetramethyl ammonium hydroxide) is used as an etching solution, and an etching temperature may be set to 80° C., and an etching time may be set to 30 seconds. When the alkaline solution containing TMAH is used as the etching solution, a concentration of the TMAH may be suitably set according to a structure material or a thickness of the semiconductor layer 6.

Here, as described above, the semiconductor layer 6 is composed of AlN layer, and AlGaN layer is formed on a underlayer of the AlN layer, an etching rate for the etching solution (alkaline solution) becomes faster in the AlN layer than the AlGaN layer. Therefore, when wet-etching is applied to the light extraction surface 7 formed by the AlN layer, the AlGaN layer (Al$_x$Ga$_{1-x}$N layer, satisfying 0<x<1) can function as an etching stop layer.

When the light extraction surface 7 of the semiconductor layer 6 is actually etched, as shown in FIG. 2(C), the convex portions 15 are formed with portions where the impressions 14 are formed as top portions, and a plurality of facets of the semiconductor crystal as a side face thereof. At this time, in the plane of the light extraction surface 7, the place where the impressions 14 are formed, is more hardly etched than the other place. That is, the portion of the impressions 14 functions as if it is an etching mask. Therefore, hexagonal pyramid shaped convex portions 15 are formed on the light extraction surface of the semiconductor layer 6, with portions where the impressions 14 are formed as top portions. The facet of the group III nitride semiconductor is at least one crystalline geometrically equivalent plane selected from the group consisting of {10-1n} plane (n is an integer) and {11-2m} plane (m is an integer), and is typically nitrogen polar surface side {10-1-1} plane or {11-2-2} plane.

Etching is hardly applied to a part where the impression 14 is formed, and the reason thereof is not clear. However, the following point can be considered, when estimated from a result of an experiment carried out by the inventors of the present invention. That is, when a load is added locally to the light extraction surface 7 composed of the semiconductor crystal, distortion occurs in an atomic ordering constituting its crystal system, thus making it difficult to apply etching to a portion where the atomic ordering is changed.

In any case, since etching is hardly applied to the part where the impression 14 is formed, consequently the etching of the light extraction surface 7 of the semiconductor layer 6 is advanced as follows. First, in-plane of the light extraction surface 7, dissolved erosion due to etching is started at a part other than the part where the impression 14 is formed. At this time, etching is advanced first from its peripheral part in the form to leave the portion of the impression 14. Thus, in the plane of the light extraction surface 7, a plurality of facets are formed starting from the portion of each impression 14. As a result, hexagonal pyramid shaped convex portions 15 are formed, with the portions where the impressions 14 are formed as top portions and a plurality of facets as a side face thereof.

Wet-etching is performed using the abovementioned alkaline solution, until a surface layer portion of the AlGaN layer of a underlayer is etched. Thus, in the plane of the light extraction surface 7, the surface layer portion of the AlGaN layer of the underlayer is exposed, at a portion where the convex portions 15 are adjacent to each other, with the impressions 14 formed on top portions. A surface state of the exposed portion is a state roughened by etching, in other words, which is a state having a smaller height dimension than the convex portions 15, and which is a state in which a fine unevenness is formed in a random arrangement.

Further, the convex portions 15 obtained by formation of the impressions 14, are preferably formed in a form to leave the impressions 14 on the top portions of the convex portions 15, or so that at least one ridge line of the ridge lines where a plurality of facets are adjacent to each other, is formed as multi-lines. Explanation will be described hereafter in detail.

First, although etching is hardly applied to the place where the impressions 14 are formed, compared to other place, this is not a case in which the etching is not applied thereto at all. Therefore, when an etching time is prolonged, the impressions 14 become small depending on an advancement of the etching, and the impressions 14 are likely to disappear in some cases. When the impressions 14 become small, it is difficult to observe the impressions 14. Wherein, when the impressions 14 are etched, the height of the convex portions 15 which are finally formed, becomes low. Accordingly, in order to set the height of the convex portions 15 to be high as much as possible, it is preferable to apply etching to the light extraction surface 7 so as to leave the impressions 14 on the top portions of the convex portions 15.

Figure 4:
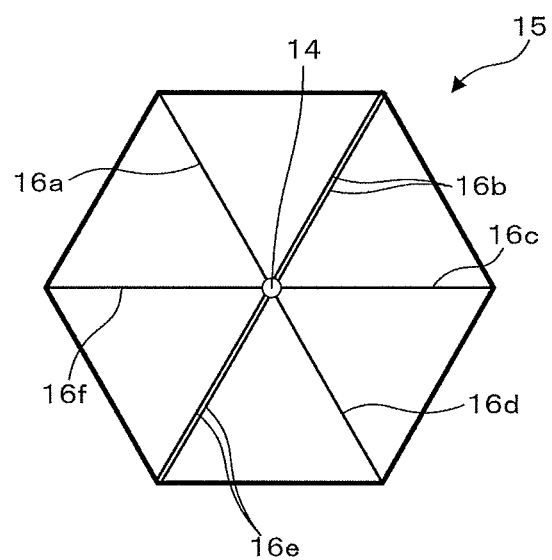
FIG. 4 is a plan view specifically schematically showing a specific example in which ridge lines of an convex portion 15 are formed as multi-lines.

Further, six facets are formed by etching, on the hexagonal pyramid shaped convex portions 15 obtained by a hexagonal semiconductor crystal. Therefore, six ridge lines where the facets are adjacent to each other, are formed in total. These ridge lines are likely to be multi-lines under an influence of the impressions 14, when a plurality of facets are formed starting from the impressions 14 as described above. The reason for the multi-lines is that since the shape of each impression 14 that acts as a mask, is not a regular hexagon, fine facets are formed for interpolating the six-sided pyramid shaped facets. Wherein, when the etching is advanced after disappearance of the impressions 14, it is conceivable that the height of the convex portions 15 becomes gradually low, and accordingly the ridge lines are changed to single lines from the multi-lines, or each ridge is shaved, and the ridge lines are hardly observed. Accordingly, in order to set the height of each convex portion 15 to be high as much as possible, it is preferable to apply etching to the light extraction surface 7 so that at least one ridge line becomes a multi-line. FIG. 4 shows a specific example of a case that the ridge lines of the convex portion 15 are changed to the multi-lines in a schematic plane view. In this specific example, two linear ridge lines 16b and 16e of six ridge lines 16a to 16f are the multi-lines, with the impression 14 interposed between them.

As a method for setting the height of the convex portion 15 to be high as much as possible, etching may be applied to the light extraction surface 7 so that at least one ridge line is a multi-line out of the ridge lines where a plurality of facets are adjacent to each other, in a state of leaving the impression 14 on the top portion of the convex portion 15.

A plurality of convex portions 15 are formed on the light extraction surface 7 of each light emitting device 3, by the abovementioned first step and second step, and an uneven pattern is formed on the light extraction surface 7 by existence of these convex portions 15. Explanation is omitted for the following manufacturing step (step of forming n-side electrode and step of forming a protective film, etc.). The abovementioned uneven pattern formation step can be performed after the n-type electrode is formed.

<2. Structure of the Semiconductor Light Emitting Device>

Explanation will be given next, for the structure of the semiconductor light emitting device according to an embodiment of the present invention.

There are several characteristics in the structure of the semiconductor light emitting device of an embodiment of the present invention, and a typical characteristic will be described here.

(First Characteristic)

Figure 5:
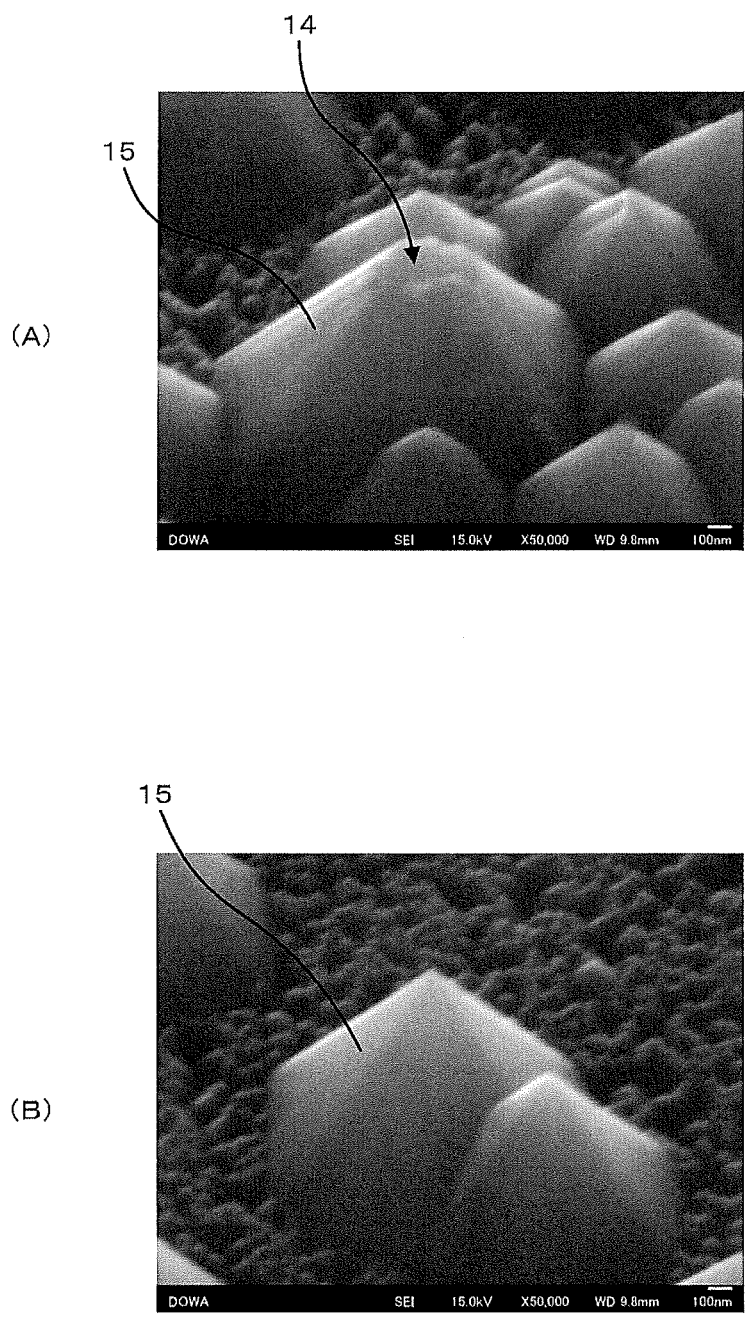
FIG. 5(A) is an electronic microscope photograph obliquely photographing the convex portion, the convex portion being obtained when impressions are formed and etching is applied thereto, and (B) is an electronic microscope photograph obliquely photographing the convex portion, the convex portion obtained when etching is applied without forming the impressions.

A first characteristic is that the impression 14 is provided on the top portion of the convex portion 15 formed on the light extraction surface 7. This impression 14 is formed on the light extraction surface 7 in the abovementioned first step, and even after etching is performed in the following second step, the impression 14 is remained on the top portion of the convex portion 15. When there is the impression 14 on the top portion of the convex portion 15, the top portion of the convex portion 15 is in a slightly geometrically collapsed state (typically a slightly recessed state) by the existence of the impression 14 on the top portion of the convex portion 15. On the other hand, when wet-etching is applied to the light extraction surface 7 as conventional without forming the impression 14, the top portion of the convex portion remained after etching becomes a pointed portion. For reference, FIG. 5(A) shows an electronic microscope photograph obliquely photographing the convex portion obtained when etching is applied thereto, with the impression formed, and FIG. 5(B) shows an electronic microscope photograph obliquely photographing the convex portion obtained when etching is applied thereto without forming the impression. The top portion of the convex portion 15 shown in FIG. 5(A) is slightly depressed by existence of the impression 14, but the top portion of the convex portion 15 shown in FIG. 5(B) is a pointed portion. FIG. 5(A) and FIG. 5(B) are views for experimentally confirming a formal difference of the convex portion in a case of forming the impression and in a case of not forming the impression, and there is no particular meaning in the arrangement of the convex portions.

(Second Characteristic)

A second characteristic is that at least one ridge line is a multi-line, out of the ridge lines where a plurality of facets of the convex portions 15 are adjacent to each other, the convex portions 15 being formed into hexagonal pyramid shapes on the light extraction surface 7. The ridge line of the hexagonal pyramid shaped convex portion 15 is changed to the multi-line when etching is applied thereto in the following second step, due to the formation of the impression 14 on the light extraction surface 7 in the abovementioned first step. Meanwhile, when wet-etching is applied without forming the impression 14 on the light extraction surface 7 as conventional, the top portion of the convex portion becomes the pointed portion as described above, and the facets and the ridge lines are formed starting from this pointed portion, and therefore the ridge line is a single line as long as there is no defect, etc., in an original crystal structure.

(Third Characteristic)

A third characteristic is that the arrangement of the plurality of convex portions 15 formed on the light extraction surface 7, becomes a regular arrangement. The arrangement of the plurality of convex portions 15 formed on the light extraction surface 7, is determined by the arrangement of the protrusions 12 of the processing substrate 11 used in the first step. This is because each convex portion 15 is formed starting from the position of the impression 14 formed by a contact of the protrusions 12 of the processing substrate 11. Therefore, for example when a plurality of protrusions 12 of the processing substrate 11 are geometrically arranged at constant intervals, a plurality of convex portions 15 are formed on the light extraction surface 7 at the same intervals and arrangement as those of the protrusion 12. On the other hand, when the wet-etching is applied without forming the impressions 14 on the light extraction surface 7 as conventional, a plurality of convex portions are irregularly (at random) arranged.

(Fourth Characteristic)

A fourth characteristic is that the heights of the plurality of convex portions 15 formed on the light extraction surface 7 are aligned in an approximately uniform height. In other words, variation of the height of each convex portion 15 is small. On the other hand, when the wet-etching is applied without forming the impressions 14 on the light extraction surface as conventional, the heights of the plurality of convex portions are not aligned. In other words, the variation of the size of each convex portion is large.

(Fifth Characteristic)

A fifth characteristic is that the surface layer portion (portion roughened by etching) of the AlGaN layer corresponding to the first conductive layer, exists regularly between the plurality of convex portions 15 formed on the light extraction surface 7. On the other hand, when the wet-etching is applied without forming the impressions 14 on the light extraction surface 7 as conventional, the arrangement of the plurality of convex portions becomes irregular, and therefore the surface layer portion of the AlGaN layer also irregularly exists.

(Sixth Characteristic)

A sixth characteristic is that the plurality of convex portions 15 formed on the light extraction surface 7 are composed of AlN. This is because the semiconductor layer 6 which is a base for forming the convex portions 15, is formed as AlN layer. The semiconductor layer 6 may also be the GaN layer for example. However, in the experiment performed by the inventors of the present invention, the result of preferably using the AlN layer, can be obtained. Specifically, when the impressions 14 are formed on the light extraction surface 7 using the semiconductor layer 6 as GaN layer, the following experiment result is obtained: the etching rate is slow and the variation is large in the height and the arrangement of the convex portions 15 obtained by etching, compared with a case when the AlN layer is employed. Therefore, in the method of manufacturing the semiconductor light emitting device, the semiconductor crystal of the semiconductor layer 6 is preferably the crystal of AlGaN having 0.5 or more Al composition, and is most preferably the crystal of AlN. In the structure of the semiconductor light emitting device, the semiconductor light emitting device is preferably made of AlGaN having 0.5 or more Al composition in the convex portion 15, and is most preferably made of AlN.

(Seventh Characteristic)

A seventh characteristic is that an average height of the plurality of convex portions 15 formed on the light extraction surface 7, is not less than a thickness of the semiconductor layer 6 which is a base of the convex portions. As the technical support, mainly following two points can be given. One of them is that by digging the surface layer portion of the first conductive layer (AlGaN layer) by etching, a total digging depth by etching is not less than a thickness of the semiconductor layer 6. The other one is that by a function of the impression 14 formed on the light extraction surface 7 like an etching mask, the portion of the impression 14 remains on the top portion of the convex portion 15. Meanwhile, when the wet-etching is performed without forming the impression 14 on the light extraction surface 7 as conventional, the mask function by the impression 14 cannot be obtained, and the average height of the convex portions is less than the thickness of the semiconductor layer which is the base of the convex portions.

(Eighth Characteristic)

An eighth characteristic is that by suitably setting a processing condition of the pattern formation step, an arrangement state of the plurality of convex portions 15 formed on the light extraction surface 7, becomes significantly highly dense with a specific regularity (details are described later).

The processing condition in the uneven pattern formation step will be described next.

(Relation between a Loading Condition and an Arrangement Condition of the Convex Portions)

The inventors of the present invention use the processing substrate 11, and change the loading condition per one protrusion added on the light extraction surface 7, and confirm the regularity in the arrangement of the convex portions 15 obtained by wet-etching under each condition. The result will be described hereafter.

First, as the loading condition added on the light extraction surface 7, the load per one protrusion is set as follows: first load=0.1 mgf, second load=0.7 mgf, third load=4.6 mgf, fourth load=6.3 mgf, and fifth load=332.9 mgf.

The load per one protrusion is a value obtained by dividing a press load for pressing the processing substrate 11 by the number of protrusions of the processing substrate in contact with the light extraction surface by points. The processing substrate on which the protrusions are arranged at an interval of 1 μm is used for the first load and a second load, and the processing substrate on which the protrusions are arranged at an interval of 3 μm is used for the third load and the fourth load. Then, by forming the impressions under each loading condition, a plurality of semiconductor light emitting devices are fabricated under different loading conditions. At this time, AlN layer having a thickness of 0.8 μM is formed in each semiconductor light emitting device, and the impressions are formed using a common processing substrate in its surface, and thereafter wet-etching is applied to the surface of the AlN layer (surface corresponding to the light extraction surface, and a nitrogen polar surface) under the following etching condition.

(Etching Condition)

Etching solution: TMAH (22 wt %)

Etching temperature: 80° C.

Etching time: 15 sec

Figure 6:
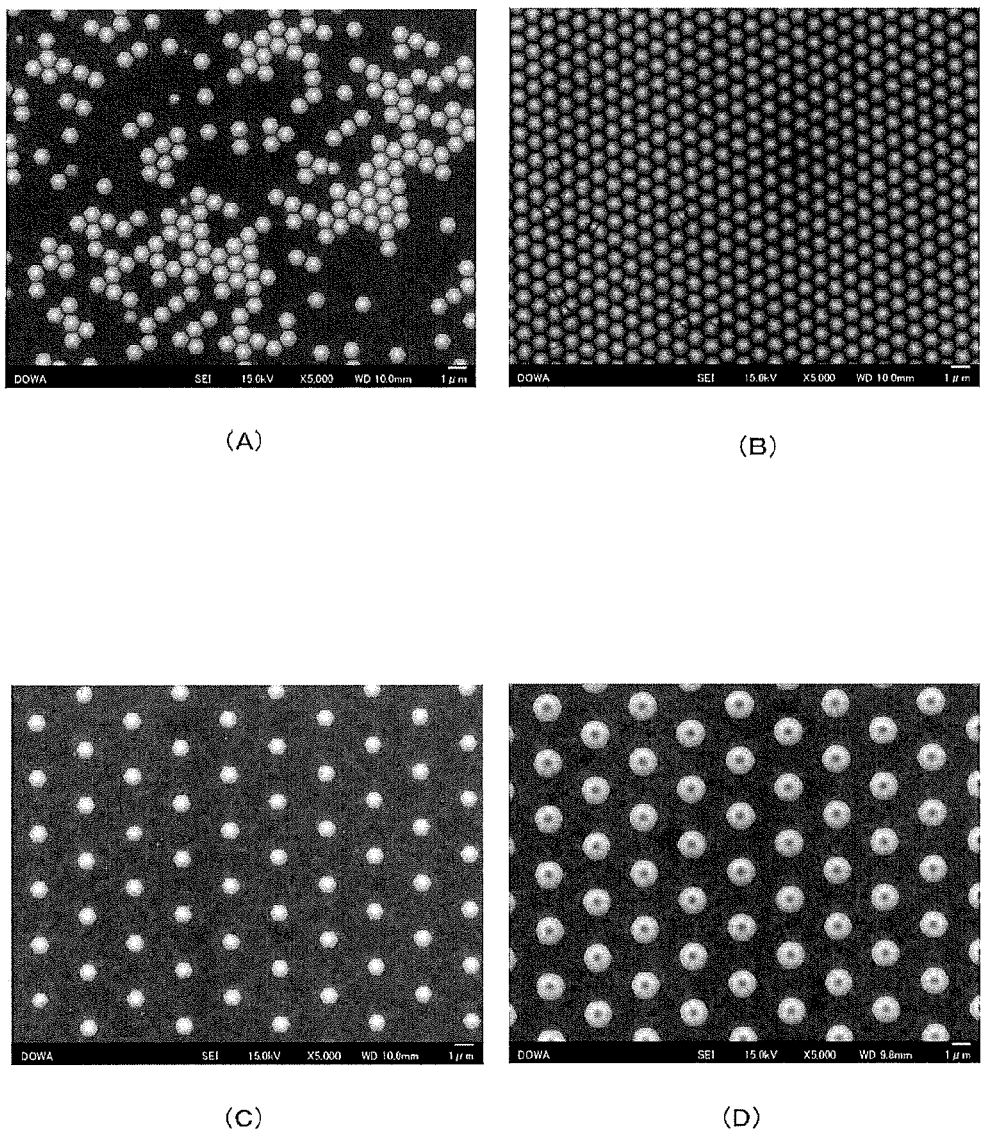
FIGS. 6(A) to (D) are electronic microscope photographs photographing an uneven pattern of a light extraction surface from immediately above, the uneven pattern being obtained when wet-etching is applied to a part where impressions are formed while varying a load added to the light extraction surface.

As a result, when the load is set to the first load, almost no regularity is observed in the arrangement of the convex portions, but when the load is set to the second load, partial regularity is observed. On the other hand, when the load is set to the third load, the fourth load, and the fifth load, the arrangement of the convex portions 15 is a regular arrangement in any case. For reference, FIG. 6(A) to FIG. 6(D) show the electronic microscope photograph photographing from just above the uneven pattern of the light extraction surface after wet-etching. FIG. 6(A) shows a case when the load is set to the second load, FIG. 6(B) shows a case when the load is set to the third load, FIG. 6(C) shows a case when the load is set to the fourth load, and FIG. 6(D) shows a case when the load is set to the fifth load. From this experiment result, it is found that in order to obtain a regular arrangement of the plurality of convex portions 15 formed on the light extraction surface 7, the load per one protrusion is preferably set to 1 mgf or more and 400 mgf or less. This is because when the load per one protrusion is less than 1 mgf, the load is insufficient for uniformly forming the impressions, and when the load exceeds 400 mgf, the impressions become excessively large, thus possibly allowing a crack to be generated in the semiconductor layer. The load per one protrusion is preferably set to 4 mgf or more and 40 mgf or less.

(Relation between the Thickness of the Semiconductor Layer 6 and the Height of the Convex Portion)

The inventors of the present invention experimentally confirm a relation between the thickness of the semiconductor layer 6 formed on the light extraction surface, and the height of the convex portion 15 formed based on the thickness of the semiconductor layer 6. The result will be described hereafter.

EXAMPLES

Example 1

Sc was sputtered on AlN template substrate having AlN single crystal layer on a sapphire substrate, and thereafter heat treatment was applied thereto in an ammonia atmosphere, to form ScN lift-off layer. Next, AlN layer was formed on the ScN lift-off layer as the semiconductor layer 6, with a thickness of 0.6 μm. Next, n-AlGaN layer, AlInGaN quantum well active layer (light emitting wavelength of 340 nm), p-AlGaN layer were sequentially formed on the AlN layer. Thereafter, p-type electrode (Ni/Au) was formed on the p-AlGaN layer, and the supporting substrate (Si substrate) was adhered thereto by Au adhesion. Thereafter, the AlN template substrate which was a substrate for growth, was peeled-off by removing the ScN lift-off layer by hydrochloric acid. At this time, the surface of the AlN layer of the exposed semiconductor layer 6 is a nitrogen polar surface, which is a light extraction surface. On this surface, formation of the impressions and wet-etching were performed under the following conditions. At this time, etching was applied down to the surface layer portion of the n-AlGaN layer which was an underlayer of the AlN layer.

(Conditions for Forming Impressions)
Processing substrate: a patterned sapphire substrate with a pattern pitch of 3 μm
Load added on the processing substrate: 6 MPa
Load per one protrusion: 6.3 mgf
(Etching Condition)
Etching solution: TMAH (22 wt %)
Etching temperature: 80° C.
Etching time: 30 sec Example 2

A similar processing as example 1 was performed, other than a point that the thickness of the AlN layer of the semiconductor layer 6 was set to 1.0 μm.

Example 3

A similar processing as example 1 was performed, other than a point that the thickness of the AlN layer of the semiconductor layer 6 was set to 2.0 μm.

Comparative Example 1

A similar processing as example 1 was performed, other than a point that formation of the impressions on the light extraction surface was not performed.

Comparative Example 2

A similar processing as example 2 was performed, other than a point that formation of the impressions on the light extraction surface was not performed.

Comparative Example 3

A similar processing as example 3 was performed, other than a point that formation of the impressions on the light extraction surface was not performed.

Comparative Example 4

A similar processing as example 2 was performed, other than a point that formation of the impressions on the light extraction surface and the etching were not performed.

Figure 7:
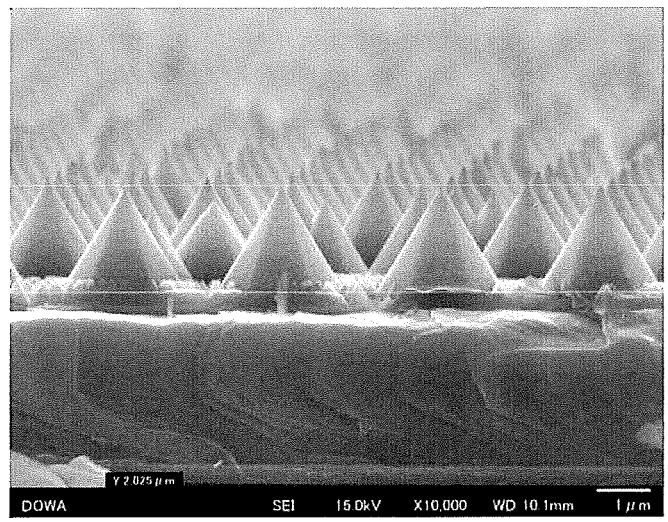
FIG. 7(A) is an electronic microscope photograph of convex portions when impressions are formed and etching is applied thereto, and (B) is an electronic microscope photograph of convex portion when etching is applied without forming the impressions.
Figure 7:
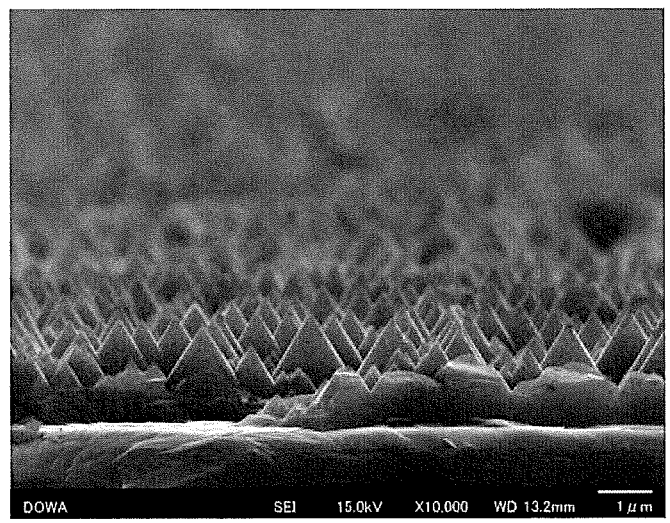

FIG. 7(A) is an electronic microscope photograph showing the shape and arrangement of the convex portions of example 2 obtained when formation of impressions and etching are performed to the AlN layer with a thickness of 2.0 μm under the abovementioned condition. From the electronic microscope photograph of a cross-sectional face as shown in FIG. 7(A), it is found that since an angle of the side face with respect to the hexagonal pyramid shaped bottom face of the convex portion is about 62 degrees, the facet constituting the side face is {10-1-1} plane.

The heights of the plurality of convex portions are uniform in any example, and as shown in FIG. 7(A), when a cross-sectional microscope photograph is taken, the bottom and the top of each convex portion can be linearly approximated, and therefore the interval between these straight lines is set as an average height. The average height of the convex portions of the AlN layer with a thickness of 0.6 μm according to example 1 was 1.0 μm, and the average height of the convex portions of the AlN layer with a thickness of 1.0 μm according to example 2 was 1.2 μm, and the average height of the convex portions of the AlN layer with a thickness of 2.0 μm according to example 2 was 2.0 μm.

FIG. 7(B) is an electronic microscope photograph showing the shape and arrangement of the convex portions of comparative example 2 obtained when only etching was performed to the AlN layer with a thickness of 2.0 μm under the abovementioned condition without performing formation of impressions. As shown in FIG. 7(B), in any comparative example, the heights of the plurality of convex portions are not uniform, in which the heights of the convex portions are non-uniform. Therefore it is difficult to obtain the average height. Accordingly, when evaluated by a maximum height, the maximum height of the convex portions of the AlN layer with a thickness of 0.6 μM according to comparative example 1 was 0.6 μm, the maximum height of the convex portions of the AlN layer with a thickness of 1.0 μm according to comparative example 2 was 1.0 μm, and the maximum height of the convex portions of the AlN layer with a thickness of 2.0 μm according to comparative example 3 was 1.2 μm.

When the heights of the convex portions of the examples and the comparative examples were compared in consideration of the above point, it was found that the heights of the convex portion of the examples were higher. In the examples, any one of the convex portions had the height larger than the thickness of the AlN layer, and meanwhile, in the comparative examples, the heights of the convex portions were smaller than the thickness of the AlN layer even in a case of a largest convex portion.

(Specifying a Light Output of the Semiconductor Light Emitting Device)

In order to measure a degree of a difference of a light output of the semiconductor light emitting device between a case of example 2 and a case of comparative example 2, comparative example 4 is fabricated in which neither formation of impression nor etching was performed, and an electrode was formed in each case.

An emission output at a current of 50 mA was 0.408 mW in comparative example 2, and 0.446 mW in example 2. When an output increase rate due to formation of an unevenness, with respect to an output (0.325 mW) of comparative example 4 was calculated, the output increase rate of example 2 was 137% which was larger than 126% of comparative example 2. An output ratio of example 2 with respect to comparative example 2 was 1.09, and the output increase of 9% was obtained due to the formation of impressions. Namely, it is found that a light extraction effect was higher in the unevenness of example 2 than in the unevenness of comparative example 2.

(A Relation between a Thickness of the Semiconductor Layer 6 and a Pitch of the Protrusions 12)

In the manufacturing method of an example of the present invention, the convex portions 15 are formed on the light extraction surface 7 in accordance with the arrangement of the protrusions 12 of the processing substrate 11. Therefore, the pitch of the convex portion 15 was determined depending on the pitch of the protrusions 12 of the processing substrate 11. Further, the shape of each convex portion 15 is a hexagonal pyramid shape. In this case, when etching is applied to the light extraction surface 7 under a condition in which a thickness dimension of the semiconductor layer 6 and the pitch of the protrusions 12 (impressions 14) are approximately the same and when the convex portions 15 are formed in a height corresponding to the thickness dimension of the semiconductor layer 6, a plurality of convex portions 15 are arranged as shown in FIG. 8(A) and FIG. 8(B). In this example, triangle regions 17 in plan view were interposed between the hexagonal convex portions 15 in plan view. The regions 17 are formed so that the surface layer portion of the AlGaN layer of the underlayer is exposed by etching. Fine unevenness is formed in the region 17. On the other hand, when the impressions 14 are formed by pressing the protrusions 12 which are arranged at a smaller pitch than the thickness dimension of the semiconductor layer 6 and etching is applied thereto, a foot portion of each convex portion 15 is interfered with each other, before an etching amount reaches an amount corresponding the thickness dimension of the semiconductor layer 6. As described above, a relation between the thickness of the semiconductor layer 6 and the pitch of the protrusions 12 of the processing substrate 11, is preferably set in a mutually equal relation.

Further, regarding the processing substrate 11, not only the pitch of the protrusions 12, but also a relation between a direction of the arrangement of the protrusions 12 and a direction of a crystal plane of the semiconductor crystal of the semiconductor layer 6, is important.

Figure 8:
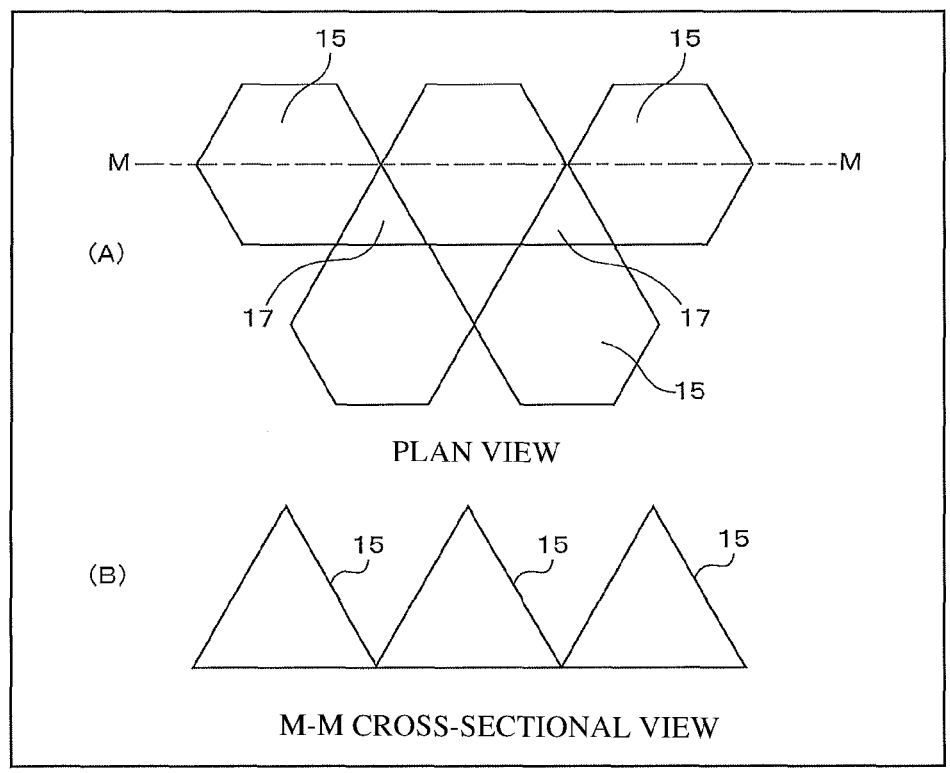
FIG. 8 is a view showing an example of an arrangement state of a plurality of convex portions, wherein (A) is a plan view and (B) is a cross-sectional view taken along the line M-M.
Figure 9:
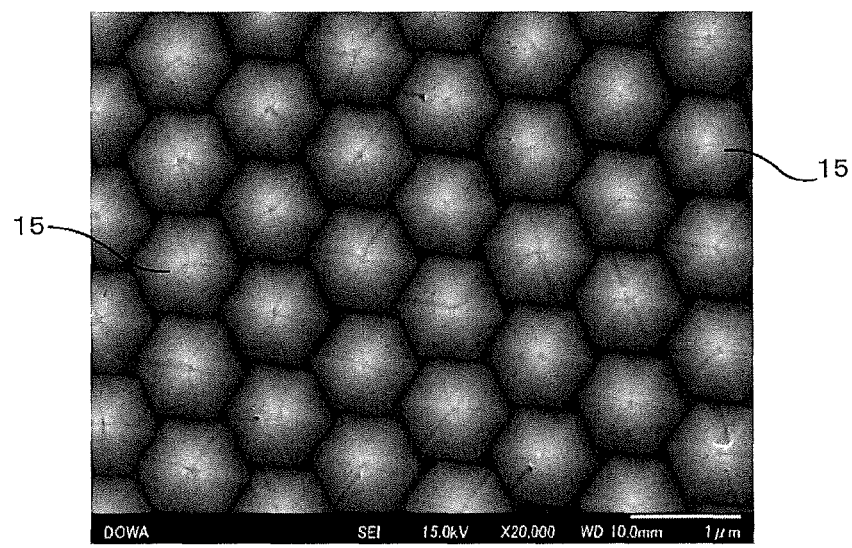
FIG. 9 is an electronic microscope photograph when a plurality of convex portions are formed in a close-packed structure.

Specifically, when the convex portions 15 are formed as shown in FIG. 8, a density of the convex portions 15 is considerably higher. However, strictly speaking, it is impossible to form a so-called close-packed structure in which the density of the convex portions 15 is highest due to an interposition of the abovementioned regions 17. When the convex portions 15 are arranged as shown in FIG. 8, the close-packed structure is obtained by 90° rotation of a direction of the processing substrate 11 used for formation of the impressions. FIG. 9 shows the electronic microscope photograph when a plurality of convex portions are formed by the inventors of the present invention in the close-packed structure. In this example, both of the thickness dimension of the semiconductor layer (AlN layer) 6 and the pitch dimension of the protrusions 12 of the processing substrate 11 are set to 1 µm, and a plurality of convex portions 15 are formed on the light extraction surface 7. In the electronic microscope photograph of FIG. 9, a high density portion (black portion) around each convex portion 15, is a portion where the surface layer portion of the underlayer (AlGaN layer) is exposed by etching. Further, the electronic microscope photograph of FIG. 9 shows that there are a plurality of convex portions with a plurality of ridge lines.

Example 4

Figure 10:
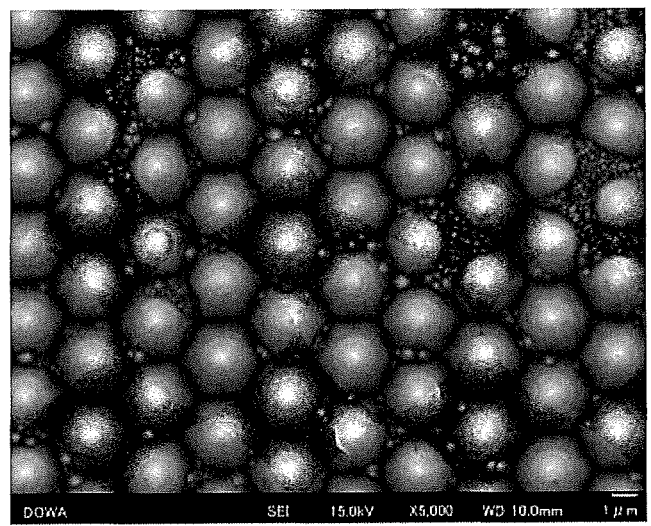
FIG. 10 is an electronic microscope photograph of the convex portions according to an example.
Figure 10:
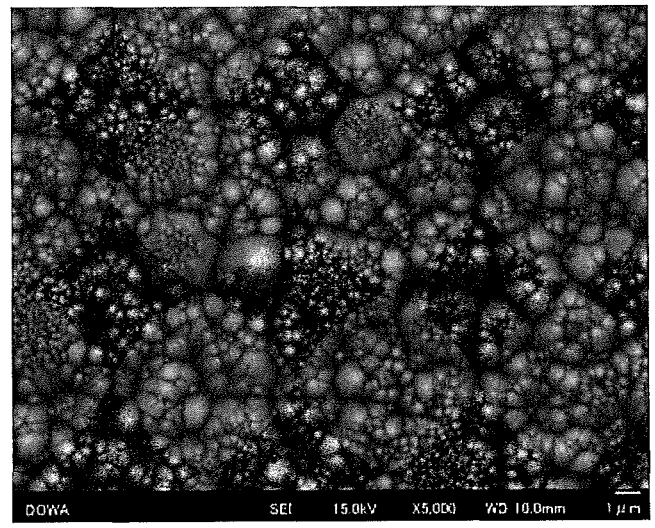

Processing was performed similarly to example 1, excluding a point that the direction of the processing substrate used for the formation of impressions was rotated by 90°, and the thickness of the AlN layer of the semiconductor layer 6 was set to 1.0 µm, and an etching time was set to 4 minutes. FIG. 10(A) shows the electronic microscope photograph of the convex portions obtained at this time. Since the etching time was prolonged, n-AlGaN layer under the AlN layer was also etched, and the average height of the convex portions was 3.0 µm. It is found that collapse of a shape occurs in a region where the n-AlGaN layer is etched, and this region is likely to have a random shape.

Comparative Example 5

Processing was performed similarly to example 4 excluding a point that the formation of impressions was not performed on the light extraction surface. FIG. 10(B) shows the electronic microscope photograph of the convex portions obtained at this time.

(Specification of a Light Output of the Semiconductor Light Emitting Device)

Measurement was performed to obtain a degree of a difference of a light output of the semiconductor light emitting device between a case of example 4 and a case of comparative example 5. Regarding the emission output at a current of 50 mA, an output ratio in example 4 with respect to comparative example 5 was 1.10, and the output increase of 10% was obtained due to the formation of impressions.

<3. Effect of Embodiments>

According to the embodiments of the present invention, the following effect can be obtained.

When the uneven pattern is formed on the light extraction surface 7 of the semiconductor light emitting device, a plurality of convex portions 15 are formed in accordance with the arrangement of the plurality of impressions 14, by forming the plurality of impressions 14 on the light extraction surface 7 and wet-etching is applied thereto. Therefore, the arrangement of the plurality of convex portions 15 can be controlled using the arrangement of the plurality of impressions 14 as a control parameter. As a result, when the uneven pattern is formed on the light extraction surface 7 for improving the light extraction efficiency, the plurality of convex portions 15 can be formed in a desired arrangement. In addition, a preferable arrangement of the convex portion 15 can be easily realized for improving the light extraction efficiency of the semiconductor light emitting device.

Further, when the impressions 14 are formed on the light extraction surface 7, the portion of each impression 14 is more hardly etched than other portion. Therefore, the height of each convex portion of the uneven pattern can be higher than a case when wet-etching is applied without forming the impressions 14. Thus, an effective area of the light extraction surface 7 becomes wider, and therefore more light can be extracted. Particularly, by applying the wet-etching to the light extraction surface 7 so as to remain the impression 14 on the top portion of the convex portion 15, the height of the convex portion 15 can be increased.

As described above, in the embodiments of the present invention, the height and the arrangement, etc., of the convex portions can be controlled by a significantly easy method, and a desired uneven pattern can be realized. This method is easier than methods such as mask formation or grinding, etc., and there is no contamination on the surface.

<4. Modified Example, Etc.>

A technical range of the present invention is not limited to the abovementioned embodiments, and includes various modifications or improvements in a range of deriving a specific effect obtained by features of the invention and a combination of them.

For example, when wet-etching is applied to the semiconductor crystal of the group III nitride semiconductor, a plurality of convex portions 15 are arranged in high density. Therefore, intervals of the protrusions 12 of the processing substrate 11 are preferably arranged at constant intervals. However, the present invention is not limited thereto. For example, the intervals of the protrusions 12 may be changed depending on the direction or the region of arranging the protrusions 12. In this case, the uneven pattern including a plurality of uneven regions with different roughness degrees can be formed in a plane, by setting the arrangement of the protrusions 12 of the processing substrate 11, so that the convex portions 15 are arranged at relatively narrow intervals in a certain region, and the convex portions 15 are arranged at relatively wide intervals in other region in the plane where the uneven pattern is formed. Further, such an uneven pattern can be formed by a single etching treatment.

In addition, in the abovementioned embodiment, the TMAH solution is used for the wet-etching applied to the light extraction surface 7. However, the present invention is not limited thereto, and for example an alkaline solution containing KOH or NaOH for example, may be used.

Further, in the abovementioned embodiment, wet-etching is given for example, as a method of etching the light extraction surface 7. However, the convex portion shape may be changed by applying dry etching after the wet-etching. Specifically, since the etching rate is different between AlN and AlGaN depending on the condition of the dry etching, the AlGaN layer can be preferentially etched by performing dry etching after the convex portions of AlN are formed in this embodiment for example, and further each convex portion can be higher.

Further, in the abovementioned embodiment, explanation is given for the method of manufacturing a semiconductor light emitting device using the group III nitride semiconductor. However, the present invention is not limited thereto, and can be widely applied as the method of manufacturing a semiconductor element for etching the semiconductor layer having a crystal structure, for the purpose of imparting a prescribed function (such as an optical function, a mechanical function, an electric function, and a chemical function, etc.) by forming the uneven pattern for example.

Further, when a bulk AlN single crystal substrate is used as the substrate for growth or a supporting substrate, the formation of the uneven pattern of the present invention may be performed on the AlN single crystal substrate. When the AlN single crystal substrate is used as a substrate for growth, a rear surface of the substrate for growth can be used as the light extraction surface, without performing lift-off of the substrate for growth.

A preferable mode in this case will be supplementarily described hereafter.

[Supplementary Description]

There is provided a method of manufacturing a semiconductor element including an uneven pattern formation step of forming an uneven pattern by applying etching to a surface of a semiconductor layer composed of a semiconductor crystal, the uneven pattern formation step including:

a first step of forming a plurality of impressions on the light extraction surface; and a second step of forming a plurality of convex portions with portions where the impressions are formed as top portions and a plurality of facets of the semiconductor crystal, with facet as a side face thereof, by applying etching to the surface of the semiconductor layer on which the plurality of impressions are formed.

DESCRIPTION OF SIGNS AND NUMERALS

1 Supporting substrate
3 Light emitting device
4 Laminated semiconductor
6 Semiconductor layer
7 Light extraction surface
11 Processing substrate
12 Protrusion
14 Impression
15 Convex portion

The invention claimed is:

1. A method of manufacturing a semiconductor light emitting device having a light extraction surface and composed of a semiconductor crystal, comprising:
  forming an uneven pattern on the light extraction surface, the formation of the uneven pattern further comprising:
  a first step of forming a plurality of pressed marks on the light extraction surface; and
  a second step of forming a plurality of convex portions with portions where the pressed marks are formed as top portions and a plurality of facets of the semiconductor crystal as a side face thereof, by applying etching to the light extraction surface on which the plurality of pressed marks are formed.

2. The method of manufacturing a semiconductor light emitting device according to claim 1, wherein in the first step, the plurality of pressed marks on the light extraction surface are formed by pressing a plurality of protrusions against the light extraction surface using a processed substrate having the plurality of protrusions.

3. The method of manufacturing a semiconductor light emitting device according to claim 1, wherein in the second step, the light extraction surface is wet-etched using an alkaline solution.

4. The method of manufacturing a semiconductor light emitting device of claim 1, wherein in the formation of the plurality of convex portions, the etching is applied to the light extraction surface, so that at least the pressed mark is remained on the top of the convex portion, or at least one ridge line of the ridge lines where the plurality of facets are adjacent to each other, is formed as multi-lines.

5. The method of manufacturing a semiconductor light emitting device according to claim 1, wherein in the second step, the convex portion is formed into a hexagonal pyramid, and a top of the hexagonal pyramid is a portion where the pressed mark is formed.

6. The method of manufacturing a semiconductor light emitting device according to claim 2, wherein in the first step, the processed substrate is made of a material having a higher hardness than the semiconductor crystal, and has the plurality of protrusions which are geometrically arranged.

7. The method of manufacturing a semiconductor light emitting device according to claim 6, wherein in the first step, the plurality of protrusions are geometrically arranged at constant intervals.

8. The method of manufacturing a semiconductor light emitting device according to claim 2, wherein in the first step, a load added on the light extraction surface is set to 1 mgf or more and 400 mgf or less per one protrusion of the processed substrate.

9. The method of manufacturing a semiconductor light emitting device according to claim 1, wherein the semiconductor crystal is a group III nitride semiconductor crystal.

10. The method of manufacturing a semiconductor light emitting device according to claim 9, wherein the group III nitride semiconductor is AlN.

11. A semiconductor light emitting device, comprising:
a light extraction surface composed of a semiconductor crystal;
wherein the light extraction surface comprises an uneven pattern in which a plurality of convex portions are lined up,
each of the convex portions has a side face composed of a plurality of facets of the semiconductor crystal,
and each convex portion has a pressed mark on the top of the convex portion thereof, or at least one ridge line arranged as multi-line of the ridge lines where the plurality of facets are adjacent to each other.

12. The semiconductor light emitting device according to claim 11, wherein the semiconductor crystal is a crystal of group III nitride semiconductor.

13. The semiconductor light emitting device according to claim 11, wherein the convex portion is made of AlN.

* * * * *